US009979320B2

(12) United States Patent
Singh et al.

(10) Patent No.: US 9,979,320 B2
(45) Date of Patent: May 22, 2018

(54) ELECTRONIC INVERTER ASSEMBLY

(71) Applicant: Deere & Company, Moline, IL (US)

(72) Inventors: Brij N. Singh, West Fargo, ND (US); Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days. days.

(21) Appl. No.: 15/248,241

(22) Filed: Aug. 26, 2016

(65) Prior Publication Data

US 2018/0062539 A1 Mar. 1, 2018

(51) Int. Cl.
*H02M 7/537* (2006.01)
*H02M 7/00* (2006.01)
(Continued)

(52) U.S. Cl.
CPC ............ *H02M 7/537* (2013.01); *G01R 15/18* (2013.01); *G01R 15/202* (2013.01); *H01L 25/072* (2013.01); *H01L 29/1608* (2013.01); *H01L 29/2003* (2013.01); *H02M 1/08* (2013.01); *H02M 7/003* (2013.01); *H02P 27/06* (2013.01); *H05K 1/117* (2013.01); *H05K 1/144* (2013.01); *H05K 1/165* (2013.01); *H05K 1/181* (2013.01); *H02M 2001/0009* (2013.01);
(Continued)

(58) Field of Classification Search
CPC ......... H02M 7/537; H02M 2001/4275; H02M 7/003
See application file for complete search history.

(56) References Cited

U.S. PATENT DOCUMENTS 5,774,353 A 6/1998 Wieloch
6,262,876 B1 7/2001 Schimanek
(Continued)

FOREIGN PATENT DOCUMENTS

EP 1615487 A2 1/2006
EP 2171836 A1 4/2010
(Continued)

OTHER PUBLICATIONS

Jih-Sheng Lai; H. Kouns; J. Bond, A Low-Inductance DC Bus Capacitor for High Power Traction Motor Drive Inverters, Conference Record of the 2002 IEEE Industry Applications Conference. 37th IAS Annual Meeting (Cat. No. 02CH37344), 2002, vol. 2, pp. 955-962, vol. 2, DOI: 10.1109/IAS.2002.1042673.
(Continued)

*Primary Examiner* — Timothy J Dole
*Assistant Examiner* — Sisay G Tiku

(57) ABSTRACT

A first driver portion comprises a set of first components mounted on or associated with a first circuit board. A second circuit board is spaced apart from the first circuit board. A second driver portion comprises a set of second components mounted on or associated with the second circuit board, where the first driver portion and the second driver portion collectively are adapted to provide input signals to the control terminal of each semiconductor switch of an inverter. A first edge connector is mounted on the first circuit board. A second edge connector is mounted on the second circuit board. An interface board has mating edges that mate with the first edge connector and the second edge connector.

15 Claims, 11 Drawing Sheets

(51) Int. Cl.
| | |
|---|---|
| *H02M 1/42* | (2007.01) |
| *H01L 29/16* | (2006.01) |
| *H01L 29/20* | (2006.01) |
| *H02M 1/08* | (2006.01) |
| *H05K 1/18* | (2006.01) |
| *H05K 1/14* | (2006.01) |
| *H01L 25/07* | (2006.01) |
| *H05K 1/11* | (2006.01) |
| *H05K 1/16* | (2006.01) |
| *H02P 27/06* | (2006.01) |
| *G01R 15/18* | (2006.01) |
| *G01R 15/20* | (2006.01) |
| *H02M 1/00* | (2006.01) |

(52) U.S. Cl.
CPC ............ *H05K 2201/042* (2013.01); *H05K 2201/10151* (2013.01); *H05K 2201/10166* (2013.01)

(56) References Cited

U.S. PATENT DOCUMENTS

| | | | | |
|---|---|---|---|---|
| 6,278,603 | B1 | 8/2001 | Arbanas et al. | |
| 6,396,332 | B2 | 5/2002 | Richardson | |
| 7,289,311 | B2 | 10/2007 | Hosking | |
| 7,453,114 | B2 | 11/2008 | Hosking | |
| 9,450,344 | B2* | 9/2016 | Cartier, Jr. | H01R 13/6585 |
| 9,722,531 | B2* | 8/2017 | Singh | H02P 29/02 |
| 2002/0060105 | A1* | 5/2002 | Tominaga | B62D 5/0406 |
| | | | | 180/443 |
| 2007/0246635 | A1* | 10/2007 | Nakajima | B60K 6/26 |
| | | | | 248/637 |
| 2007/0246636 | A1* | 10/2007 | Katayama | B60L 11/12 |
| | | | | 248/637 |
| 2009/0134828 | A1* | 5/2009 | Chakrabarti | H02P 27/08 |
| | | | | 318/440 |
| 2011/0285336 | A1* | 11/2011 | Fujita | H01L 25/072 |
| | | | | 318/400.27 |
| 2012/0229977 | A1 | 9/2012 | Hosking et al. | |
| 2013/0021749 | A1* | 1/2013 | Nakajima | H02M 7/003 |
| | | | | 361/689 |
| 2013/0044434 | A1* | 2/2013 | Sharaf | H05K 7/20927 |
| | | | | 361/702 |
| 2014/0140119 | A1* | 5/2014 | Shinohara | H02M 7/003 |
| | | | | 363/141 |
| 2014/0168900 | A1* | 6/2014 | Korich | H05K 7/1432 |
| | | | | 361/709 |
| 2014/0253108 | A1* | 9/2014 | Singh | G01R 15/181 |
| | | | | 324/227 |
| 2014/0253109 | A1* | 9/2014 | Singh | G01R 15/181 |
| | | | | 324/227 |
| 2016/0181892 | A1* | 6/2016 | Purohit et al. | B25F 5/02 |
| | | | | 310/50 |
| 2016/0365788 | A1* | 12/2016 | Singh | B60L 11/18 |

FOREIGN PATENT DOCUMENTS

| | | |
|---|---|---|
| EP | 2337210 A1 | 6/2011 |
| EP | 2953434 A1 | 12/2015 |
| EP | 3057216 A1 | 8/2016 |
| FR | 2871022 A1 | 12/2005 |
| WO | 2009008741 A1 | 1/2009 |
| WO | 2015064409 A1 | 5/2015 |

OTHER PUBLICATIONS

A. Elbanhawy, Effect of source inductance on MOSFET rise and fall times [online], Application demonstration, Maplesoft. Mar. 2008, [retrieved on May 22, 2015]. Retrieved from the Internet < URL: http://citeseerx.ist.psu.edu/viewdoc/download?doi=10.1.1.575.543&rep=rep1&type=pdf>.

European Search Report issued in counterpart application No. 17183401.3 dated Dec. 13, 2017. (5 pages).

European Search Report issued in counterpart application No. 17183402.1 dated Jan. 26, 2018. (6 pages).

* cited by examiner

US 9,979,320 B2

ELECTRONIC INVERTER ASSEMBLY

GOVERNMENT LICENSE RIGHTS

This invention was made with U.S. government support under contract or award DE-EE0006521.0001 awarded by U.S. Department of Energy. The U.S. government has certain rights in the invention.

FIELD OF DISCLOSURE

This invention relates to an electronic inverter assembly and more particularly to a compact electronic inverter assembly at a given power density with improved thermal management.

BACKGROUND

Electronic inverters can be used to control motors or to convert alternating electric current to direct electric current. In certain background art in the electronic inverter, power semiconductor switches, such as silicon carbide (SiC) and gallium nitride (GaN) devices, can be operated at much higher temperature than conventional silicon semiconductors and, hence, generate heat flux that can reduce the longevity of certain electronic components that are proximately located to the semiconductor switches. Accordingly, there is a need for compact electronic inverter assembly with improved thermal management.

SUMMARY

In accordance with one embodiment, an electronic inverter assembly comprises an inverter power module with one or more pairs of semiconductor switches mounted on a substrate. Each pair of semiconductors comprises a low-side semiconductor switch and a high-side semiconductor switch. Each of the semiconductor switches comprises a control terminal and switched terminals. A first circuit board has an outer side adjacent to or that faces the inverter power module and a first inner side opposite the outer side. A first driver portion comprises a set of first components mounted on or associated with the first circuit board. A second circuit board is spaced apart from the first circuit board. The second circuit board has a second inner side facing the first inner side. A second driver portion comprises a set of second components mounted on or associated with the second circuit board, where the first driver portion and the second driver portion collectively are adapted to provide input signals to the control terminal of each semiconductor switch. A first edge connector is mounted on the first inner side of the first circuit board. A second edge connector is mounted on the second inner side of the second circuit board. An interface board with mating edges that mate with the first edge connector and the second edge connector.

DETAILED DESCRIPTION

Figure 1:
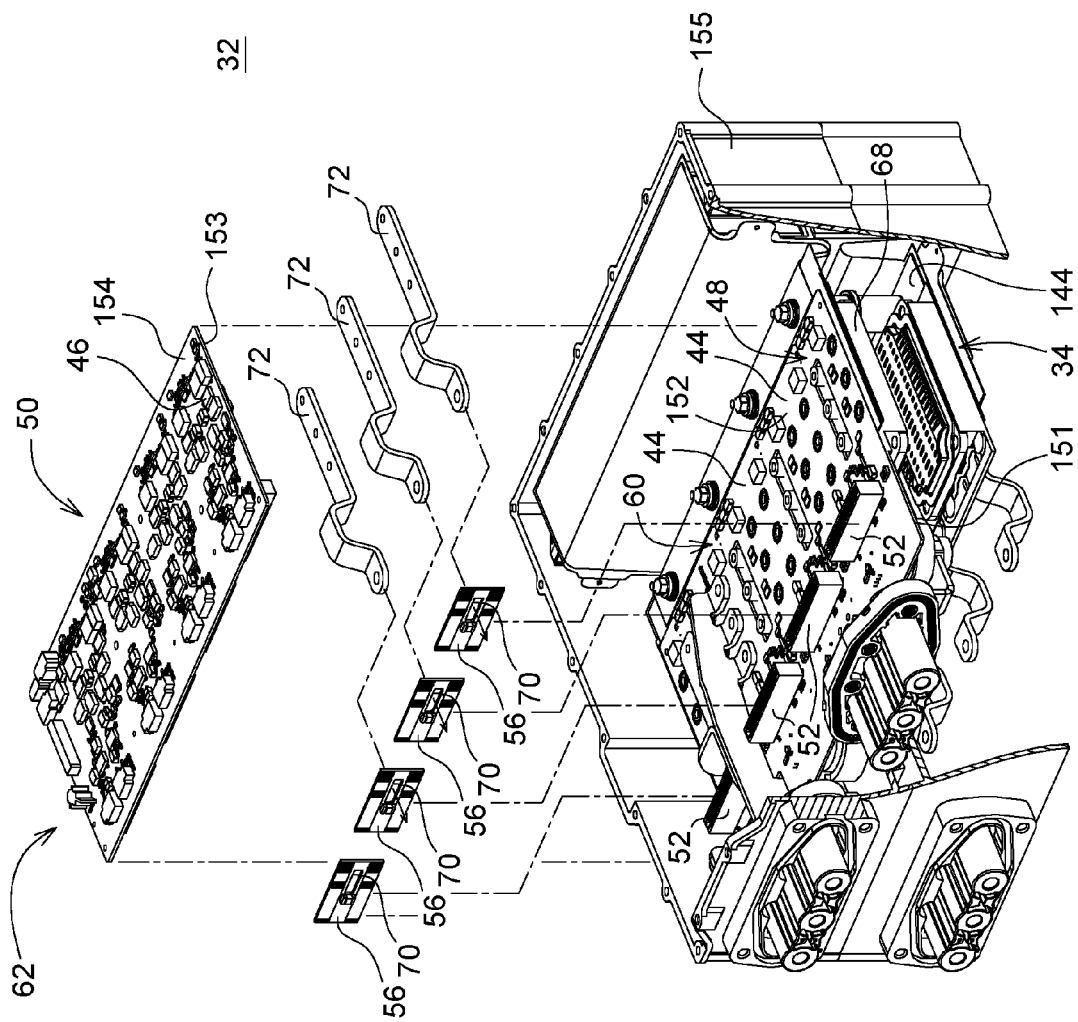
FIG. 1 is an exploded perspective view of one embodiment of the electronic inverter assembly.

In accordance with one embodiment, an electronic inverter assembly 32 comprises an inverter power module 34. The inverter power module may comprise one or more switch modules 68. Each switch module 68 comprises one or more pairs of semiconductor switches mounted on a substrate. Each pair of semiconductors comprises a low-side semiconductor switch 36 and a high-side semiconductor switch 38. The semiconductor switches could be made of silicon carbide (SiC), gallium nitride (GaN), or any wide-bandgap semiconductor material. For example, the semiconductor switches could be any of the following types of power transistors: metal oxide semiconductor field effect transistor (MOSFET), insulated gate bipolar junction transistor (IGBT), bipolar junction transistors (BJT), and the like. Each of the semiconductor switches comprises a control terminal 40 and switched terminals 42.

A first circuit board 44 has an outer side 151 adjacent to or that faces the inverter power module 34 and a first inner side 152 opposite the outer side 151. A first driver portion 48 comprises a set of first components 60 mounted on or associated with the first circuit board 44. A second circuit board 46 is spaced apart from the first circuit board 44. The second circuit board 46 has a second inner side 153 facing the first inner side 152. A second outer side 154 of the second circuit board 46 is opposite the second inner side 153. A second driver portion 50 comprises a set of second components 62 mounted on or associated with the second circuit board 46, where the first driver portion 48 and the second driver portion 50 collectively are adapted to provide input signals to the control terminal 40 of each semiconductor switch.

A first edge connector 52 is mounted on the first inner side 152 of the first circuit board 44. A second edge connector 54 is mounted on the second inner side 153 of the second circuit board 46. An interface board 56 with mating edges 58 that mate with corresponding receptacles or slots in the first edge connector 52 and the second edge connector 54.

In one embodiment, the first components 60 comprises driver circuit components with higher temperature operating ranges than the second components 62. For example, the first components 60 have a first temperature operating range of greater than or approximately equal to 150 degrees Celsius. Similarly, the second components 62 comprise driver circuit components with a second temperature operating range of between approximately 125 degrees Celsius and approximately 150 degrees Celsius. Accordingly, the first circuit board 44 may be reserved for population by first components 60 with a higher temperature operating range than the second components 62 of the second circuit board 46.

The driver comprises the first driver portion 48 and the second driver portion 50. The first driver portion 48 comprises the first circuit board 44 and the first components 60, whereas the second driver portion 50 comprises the second circuit board 46 and the second components 62. Collectively, the first driver portion 48 and the second driver portion 50 form a driver circuit (e.g., low inductance driver circuit) via one or more interface boards 56 for providing control signals to the inverter or control terminals 40 (e.g., gates or bases) of the semiconductor switches of the switch modules 68.

A set of first edge connectors 52 are mounted on the first inner side 152 of the first circuit board 44. A set of second edge connectors 54 are mounted on the second inner side 153 of the second circuit board 46. In one embodiment, each first edge connector 52 and each second edge connector 54 may comprise a surface mount card edge connector, such as those that are available through Sullins Connector Solutions of San Marcos, Calif.

Each interface board 56 has mating edges 58 that mate with a corresponding one of the first edge connector 52 and a corresponding one of the second edge connector 54. For example, the mating edges 58 mate with corresponding slots or receptacles in the connectors (52, 54). Each interface board 56 and its corresponding edge connectors supports a suitable or low inductance signal path for electrical signals of the driver circuit (58, 50) that are communicated between the first board 44 and the second board 46, or between the first board 44 and the control terminal 40 of the respective semiconductor switch (36, 38) of the switching module 68 of the inverter, or between the second board 46 and the control terminal 40 of the respective semiconductor switch (36, 38) of the switching module 68 of the inverter.

Figure 4:
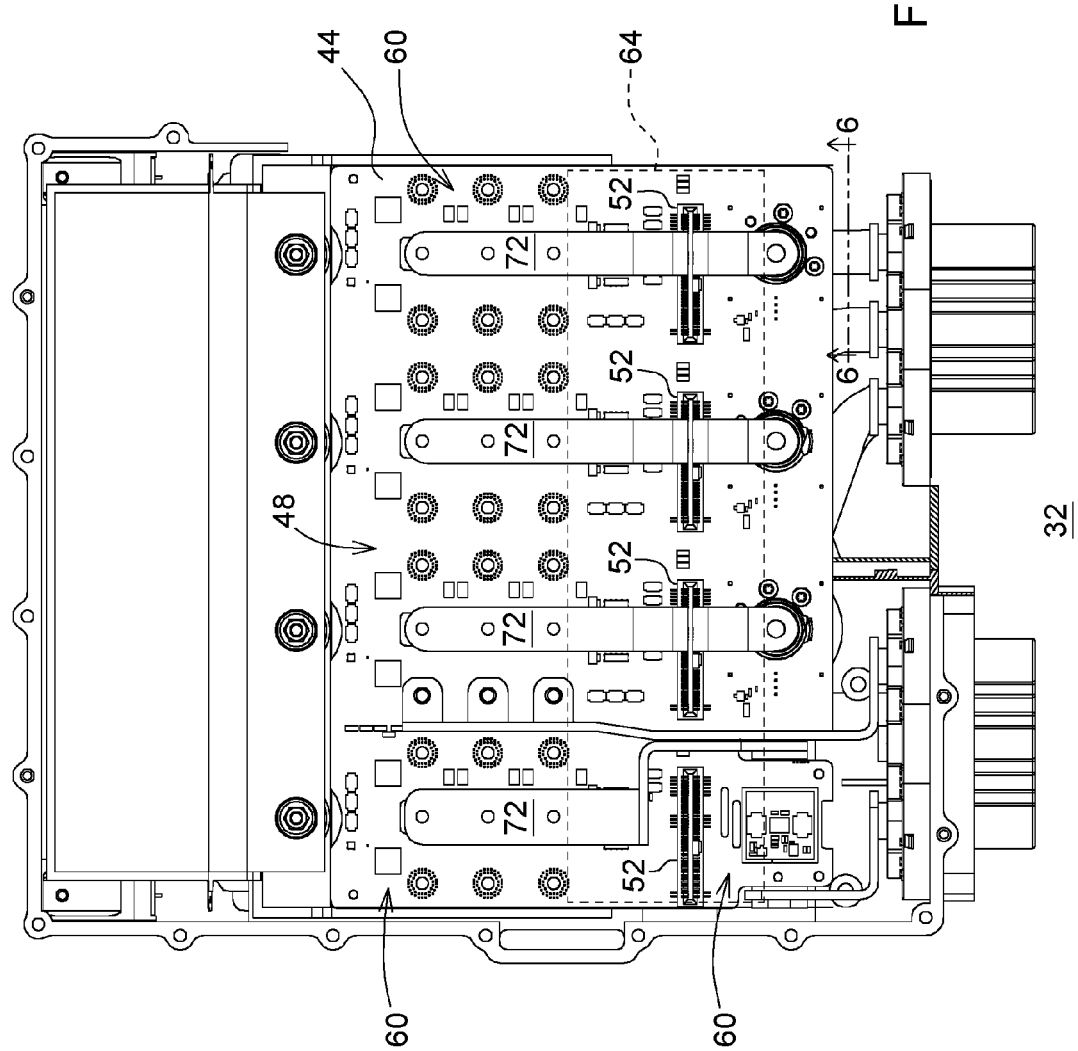
FIG. 4 is a plan view of the first circuit board of the electronic inverter assembly as viewed along reference line 4-4 of FIG. 3.

In one embodiment as best illustrated in FIG. 4, the first circuit board 44 has a first zone 64 (e.g., low inductance zone) near or within a maximum conductive trace length on the first circuit board 44 from the first edge connector 52 to minimize inductance provided to the control terminals 40 of the semiconductor switches (36, 38). The conductive traces are composed of metal, alloy or metallic material. Further, the first zone 64 may contain circuits that would otherwise be susceptible to time delay from signal communication outside of the first zone 64. The first zone 64 can include first components 60 mounted on one or both sides of the first circuit board 44.

Figure 5:
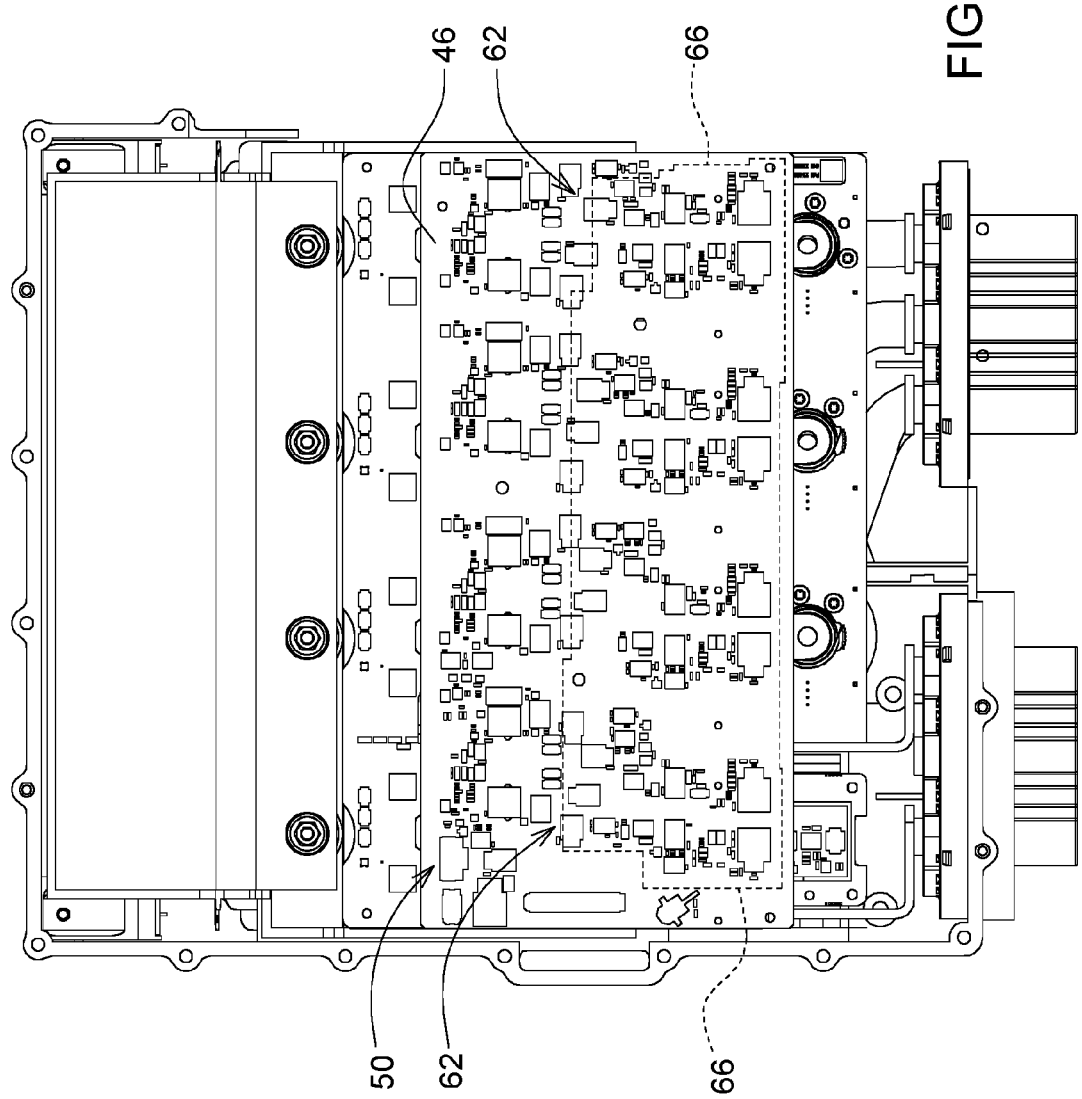
FIG. 5 is a plan view of the second circuit board as viewed along reference line 5-5 of FIG. 2.

In one embodiment as best illustrated in FIG. 5, the second circuit board 46 has a second zone 66 (e.g., low inductance zone) near or within a maximum conductive trace length on the circuit board from the second edge connector 54 to minimize inductance provided to the control terminals 40 of the semiconductor switches. Further, the second zone 66 may contain circuits that would otherwise be susceptible to time delay from signal communication outside of the second zone 66. The second zone 66 can include second components 62 mounted on one or both sides of the second circuit board 46.

In one configuration, conductive traces on the first circuit board 44 and the second circuit board 46 can be surrounded by one or more ground traces or ground planes to avoid loop current. In one embodiment on the first circuit board 44 and the second circuit board 46, conductive trace geometry can be arranged to group and separate conductive traces into three voltage classes: (1) high-voltage power traces/circuit referenced to high-side semiconductor switch 38 (e.g., metal oxide semiconductor field effect transistor (MOSFET)), (2) high-voltage power traces/circuit referenced to low-side semiconductor switch 36 (e.g., MOSFET), and (3) low-voltage power traces/circuit referenced to low-voltage electronics. In particular, the circuit board conductive traces are physically separated for necessary creepage (e.g., from thermal expansion and contraction) and clearance to meet high-voltage safety requirements and to eliminate cross-talk between time critical and performance critical circuits that serve different phases (e.g., three phases plus an optional brake chopper for single inverter) of the electronic inverter assembly 32 or inverter.

If the inverter assembly 32 is a single inverter configuration, the inverter assembly 32 may provide one or more phase output signals, such as alternating current output signals for a first phase, a second phase and a third phase. Further, the inverter assembly 32 may provide an optional fourth phase output as a brake chopper. If the inverter assembly is dual inverter configuration, the inverter assembly 32 further comprises a third circuit board 144 that is similar to the first circuit board 44. The third circuit board 144 can contain a driver circuit to drive one or more switch modules 68 or semiconductor switches (36, 38). The output of the switch modules can be at phase terminals or bus bar terminals. The direct current terminals 71 of the first circuit board 44 and the third circuit board 144 can be interconnected by a coaxial bus connector 145. For a dual inverter configuration, a primary inverter may be used in a motoring mode to control the motor 88, whereas a secondary inverter may be used in a power generation mode to convert alternating current energy into direct current energy, or in a motoring mode to control another motor or auxiliary electric machine.

In one embodiment, the first circuit board 44 is reserved for components (e.g., first components 60), circuits or both that have a first temperature operating range of greater than or approximately equal to 150 degrees Celsius. Similarly, the second circuit board 46 is reserved for components (e.g., second components 62), circuits, or both have a second temperature operating range of between approximately 125 degrees Celsius and approximately 150 degrees Celsius. Accordingly, the driver circuit 49 for the switching semiconductors of the inverter or dual inverter is split or divided into two circuit boards: the first driver portion 48 on the first circuit board 44 and the second driver portion 50 on the second circuit board 46, where the electrical connection and electrical signals communicated between the two circuit boards are subject to sufficiently low inductance. As used herein, approximately shall mean a tolerance of about plus or minus ten percent.

In one embodiment, the electronic inverter assembly 32 may be enclosed in a housing 155 with one or more coolant passages. For example, the high-temperature characteristics of certain semiconductor switches (e.g., SiC and GaN or other wide band gap devices) in inverters, support cooling of the electronic inverter assembly 32 by engine coolant (e.g., water and ethylene glycol) that is shared with or circulated in an internal combustion engine of a vehicle. The use of engine coolant for cooling the electronic inverter assembly 32 allows simplification of the vehicle because a separate dedicated cooling system for inverter can be eliminated. The electronic inverter assembly 32 can share or leverage the coolant pump and radiator of the vehicle for cooling of the electronic circuitry of the inverter assembly 32, for example. Elimination of a dedicated cooling system for inverter can result in a more compact design with a given power density required to support an electric drive system.

Because of the presence of higher ambient temperature close to engine coolant, the first circuit board 44 (e.g., lower circuit board) uses higher temperature components and is placed over switch modules 68 or inverter power module 34. For example, the first circuit board 44 may be positioned above, facing, or adjacent to the ribs or protrusions of the switch modules 68 of the inverter, where the ribs or protrusions are configured to dissipate heat or thermal energy to the ambient air. In one configuration, one or more switch modules 68 may be mounted on or in contact with the first circuit board 44.

Meanwhile, the second circuit board 46 (e.g., upper circuit board) can be designed with the relatively low temperature parts. Interconnections used for electrical connections between first circuit board 44 and the second circuit board 46 must have lowest possible inductance, and different high voltage circuits should not electrically and magnetically interact with each-other to avoid cross-talk and malfunction of gate drive.

If the interface boards 56 are used to connect the first circuit board 44 and the second circuit board 46, the built-in current sensor 76 of the interface board 56 can potentially reduce inverter cost, eliminate a separate connector used for current-sensing circuit, and minimize the size of electronic inverter assembly 32 (e.g., inverter). The interface boards 56, alone or coupled with the first zone 64 and the second zone 66, are well suited for forming low inductance connections for the circuitry of the inverter 32 and miniaturization of the current sensor 76 integrated with the connector assembly.

In one configuration, the driver circuit 49 or driver comprises a high-side driver circuit referenced to a high-side semiconductor switch 38 (e.g., SiC metal oxide semiconductor field effect transistor (MOSFET)), a low-side driver circuit referenced to a low-side semiconductor switch 36 (e.g., SiC metal oxide semiconductor field effect transistor (MOSFET)).

The interface board 56, the first circuit board 44, and the second circuit board 46 comprises a dielectric layer of a polymer, a plastic, a polymer composite, a plastic composite, a fiber reinforced polymer, a fiber reinforced plastic, or a ceramic material. Conductive traces may overlie the dielectric layer on one or both sides of the interface board 56, the first circuit board 44, and the second circuit board 46. The conductive traces are composed of a metal, an alloy or metallic material. In certain embodiments, the conductive traces on opposite sides of any circuit board may be interconnected by conductive vias or conductive through-holes.

In one embodiment, the interface board 56 comprises a current sensor board with an opening 70 for receiving an output phase terminal 72, such as a bus bar or conductor with a rectangular, polygonal or elliptical cross section. The output phase terminal 72 has a cross section (e.g., rectangular cross section) that can pass through the opening 70 or a corresponding slit in the inductor or current-sensing coil 74. Each output phase terminal 72 is configured to output a signal produced by a pair of semiconductor switches or switch module 68. In one configuration, the interface board 56 (e.g., or board that also comprises current-sensing coil) comprises a plurality of conductive traces routed through conductive vias (e.g., metallic plated vias) between two adjacent internal conductive layers of the interface board 56. The above conductive traces form an inductor or a current-sensing coil 74 for inductively coupling the electromagnetic field in the output phase terminal 72 to a corresponding current sensor 76 circuit, such as the circuit of FIG. 10. For example, the coil 74 may comprise a time-varying flux sensing (e.g., TVFS) coil 74 that is electromagnetically coupled to the output phase terminal 72 and this electrically coupled to a current sensor 76 circuit. In one configuration, the coil 74 comprises a series of conductive traces (e.g., metallic traces) that are interconnected with conductive vias (e.g., metal-plated vias or through-holes) between two adjacent layers of interface board 56.

The current sensor 76 can operate at the first temperature range, the second temperature range, or intermediate temperature ranges between the first temperature range and the second temperature range. The current sensor 76 has a bandwidth of sufficient frequency range to support a target sampling rate for accurate and timely current measurements in real time as the electronic inverter assembly 32 operates to control one or more motors 88, or to convert alternating current into direct current.

Figure 10:
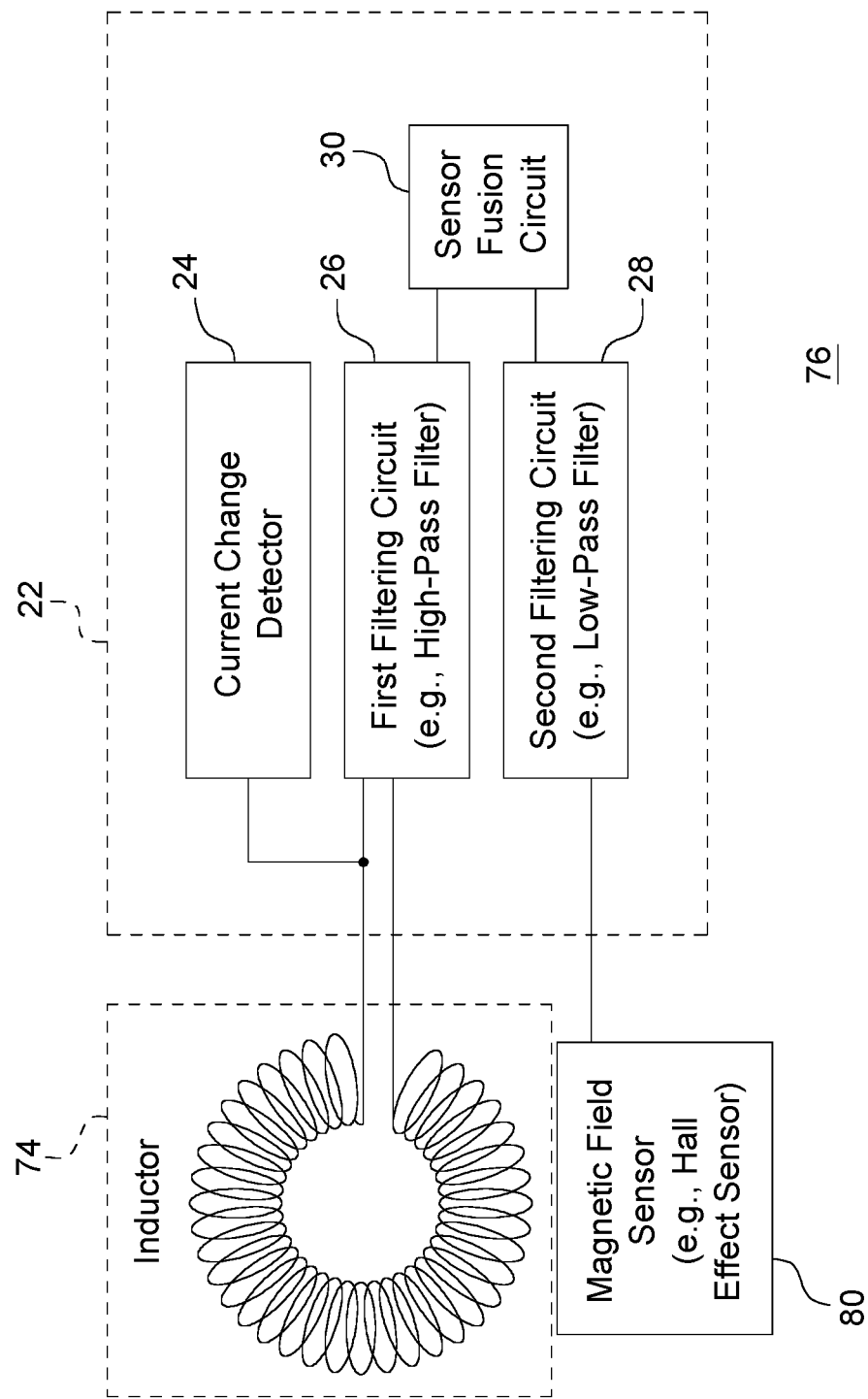
FIG. 10 is a block diagram of illustrative current-sensing circuit.

In accordance with FIG. 10, in one configuration, the current sensor 76 comprises one or more of the following: (1) primary current sensor of conductive traces of the coil 74, (2) secondary current sensor of a magnetic field sensor 80 (e.g., Hall effect sensor) overlying at least a portion of the output phase terminal 72, and (3) secondary current sensor of a magnetic field sensor 80 and one or more flux concentrators 78 on opposite sides of the magnetic field sensor 80.

In the current sensor, the primary current sensor can have a plurality of conductive traces, on the interface board 56, that form an inductor or a current-sensing coil 74 for inductively coupling the current in the output phase terminal 72 to a current sensor 76. A secondary current sensor is associated with the output phase terminal 72. For instance, the secondary current sensor 76 comprises a magnetic field sensor 80 mounted on or near the output phase terminal 72. One or more flux concentrators 78 are disposed laterally with respect to the magnetic field sensor 80.

A sensor processing circuit 22 can convert the sensed magnetic field into a respective current signal or digital representation of the current signal. The current sensor 76 can use ferrous metal shielding or filtering (e.g., ferrite core coils or ferrite beads) to eliminate electromagnetic cross-talk and interaction among inverter phases including the optional brake chopper unit. In the sensor processing circuit 22, the first sensed current from the coil 74 is fused or combined with a second sensed current from the magnetic field sensor 80, wherein the coil 74 comprises a time-varying flux sensing coil 74.

Figure 6:
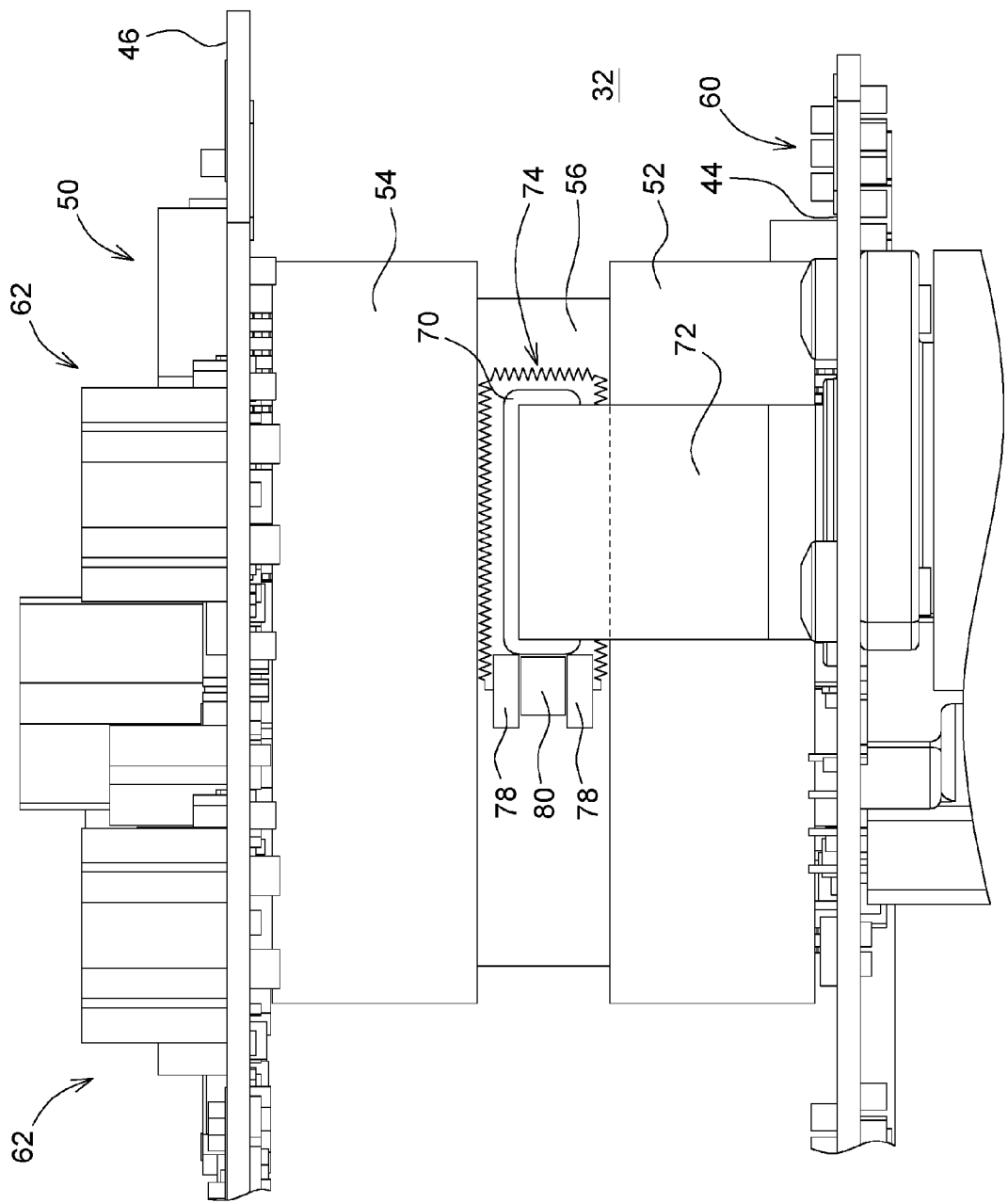
FIG. 6 is a side view of the electronic inverter assembly as viewed along reference line 6-6 of FIG. 2, where the first circuit board and the second circuit board are cut-away to show a close-up view of the inverter assembly.
Figure 7:
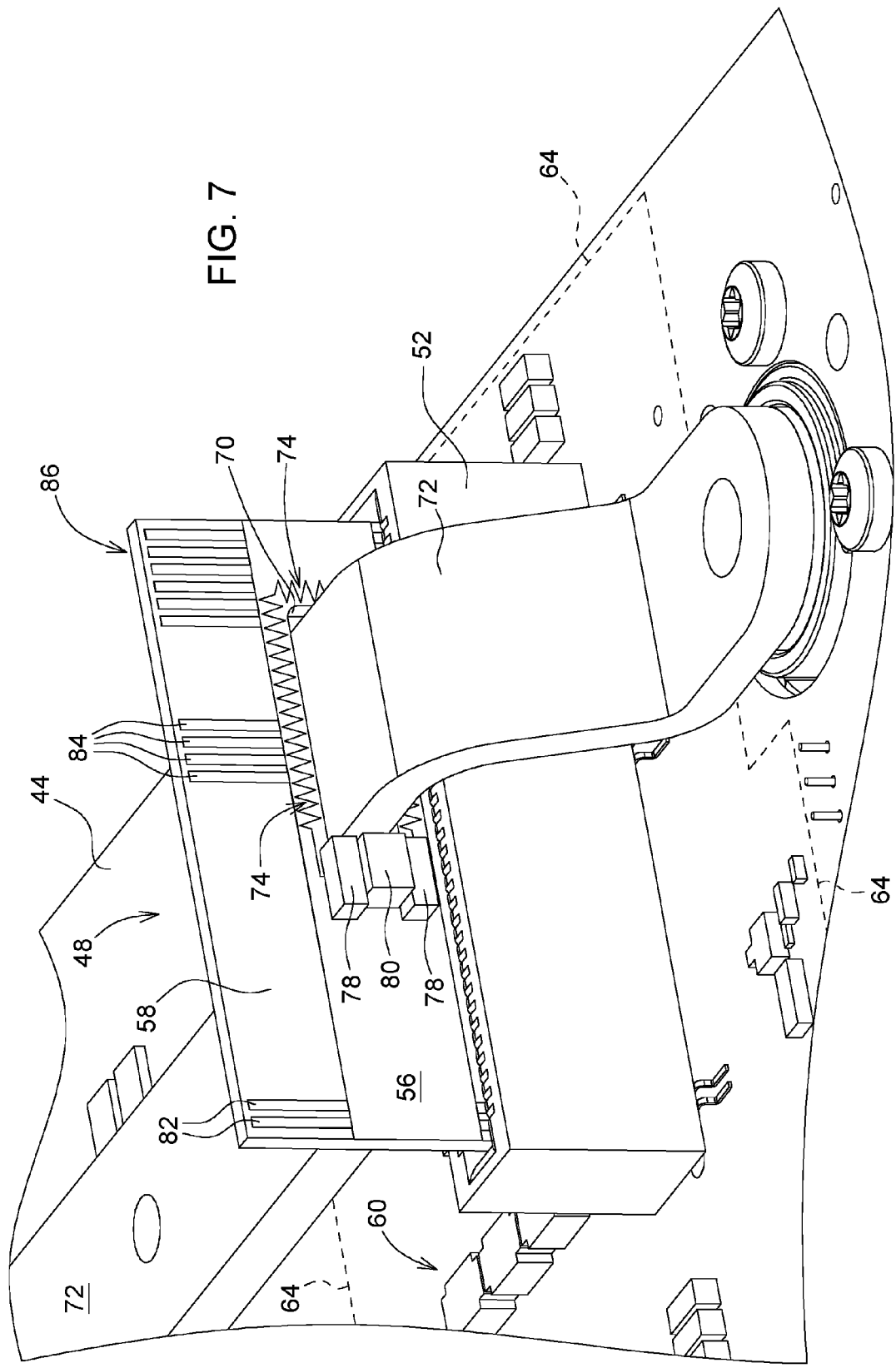
FIG. 7 is a perspective view of the electronic inverter assembly that is similar FIG. 6, except the second circuit board is removed.

In accordance with FIG. 6 and FIG. 7, for each phase the magnetic field sensor 80 is mounted on a respective interface board 56. Further, the magnetic field sensor 80 (e.g., Hall effect sensor) is surrounded by flux concentrators, or electromagnetic field concentrators to direct or focus the electromagnetic field produced by the electrical current in the output phase terminal 72 toward the magnetic field sensor 80 for detection thereby.

Figure 8:
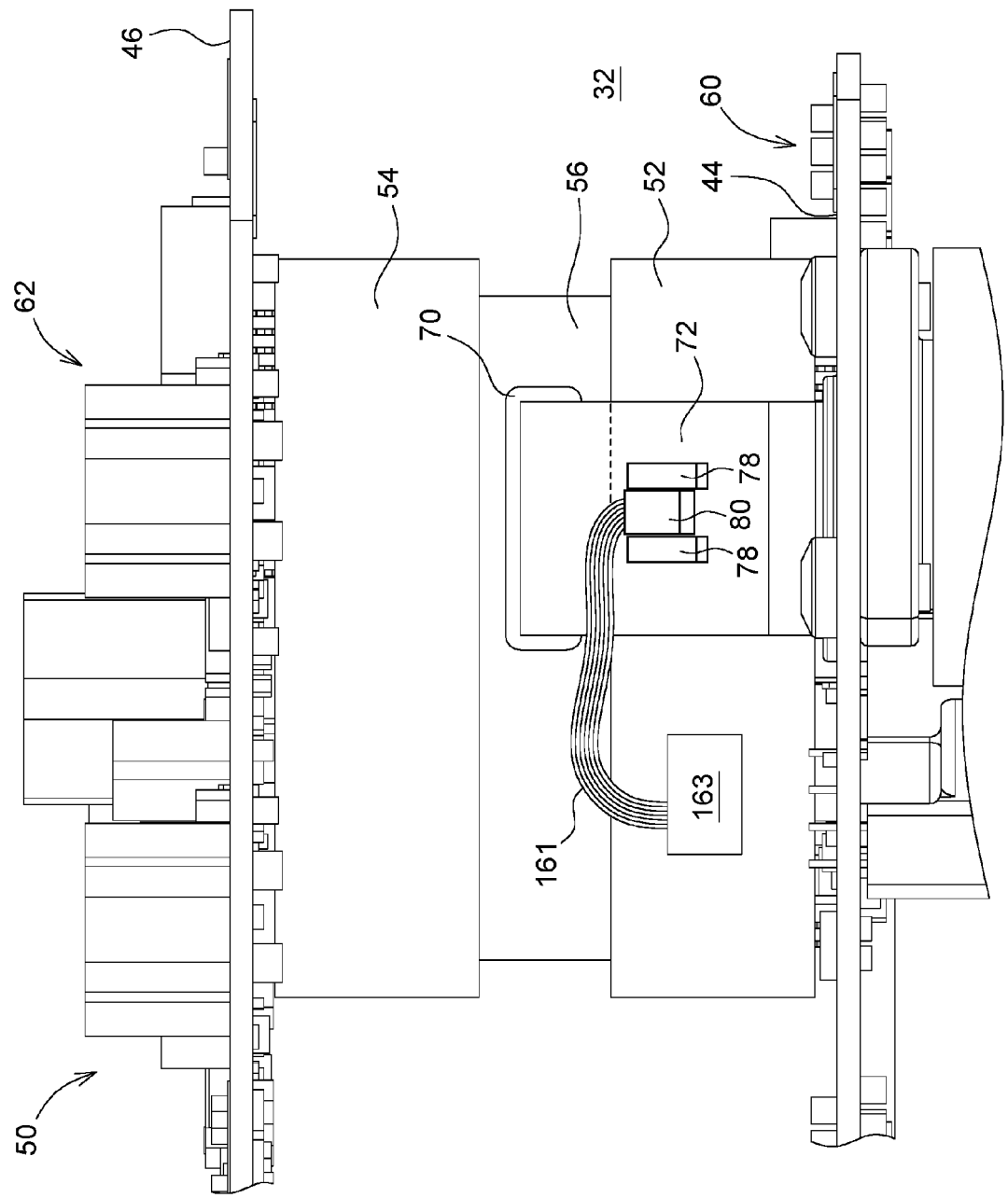
FIG. 8 is an alternate embodiment of the side view of the electronic inverter assembly, which can be compared or contrasted to the side view of FIG. 6.
Figure 9:
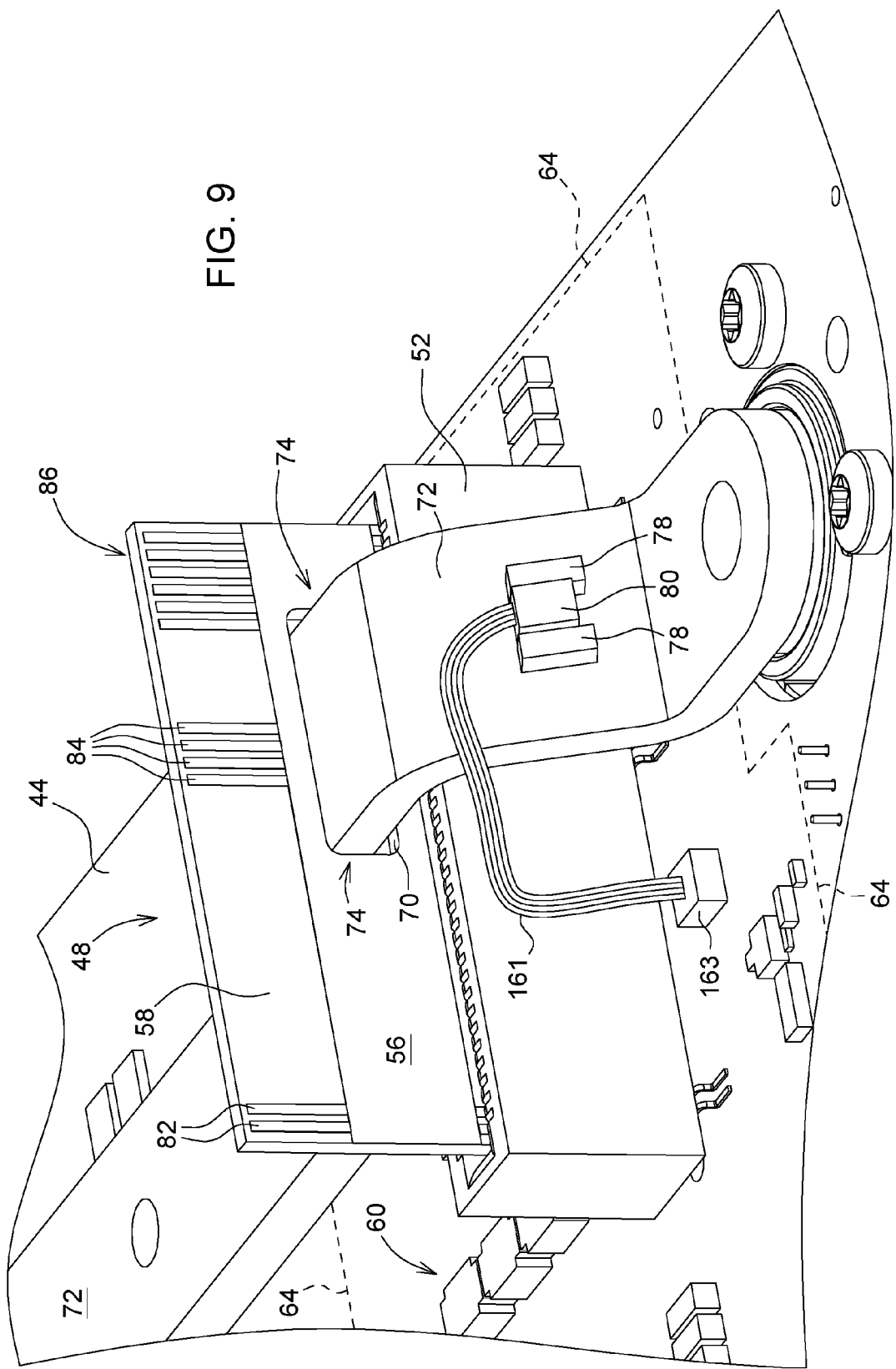
FIG. 9 is an alternate embodiment of a perspective view of the electronic inverter assembly that is similar to FIG. 8, except the second circuit board is removed.

In accordance with FIG. 8 and FIG. 9, a multi-conductor cable (e.g., ribbon cable) 161 or transmission line terminates in a multi-conductor connector 163 at a first end and is electrically connected to the secondary current sensor 76 or magnetic field sensor 80 at the second end. The multi-conductor connector 163 may be mounted on the first circuit board 44 or otherwise electrically connected to the current sensor 76. The multi-conductor cable 161 is arranged for connecting to secondary current sensor 76 (e.g., the magnetic field sensor 80) to provide the signals to signal processing circuit, such as that illustrated in the block diagram of FIG. 10. As illustrated, for each phase of the inverter, the magnetic field sensor 80 is mounted on or overlies the output phase terminal 72.

In one embodiment, the first circuit board 44 has first set of first edge connectors 52 on the first inner side 152; the second circuit board 46 has a second set of second edge connectors 54 on the second inner side 153. A set of interface boards 56 is arranged or adapted for interconnecting the first driver portion 48 and the second driver portion 50. As illustrated in the drawings, each interface board 56 handles or services one phase of the inverter, although in alternate embodiments an interface board may service multiple phases of the inverter. The interface board 56 supports low inductance connections for the input signals (e.g., driver control signals) to the control terminals 40 of the semiconductor switches of one or more switch modules 68, where the input signals are generated by the first components 60 and the second components 62, collectively.

As illustrated in FIG. 7, the first edge connectors 52 comprise three sets of traces. As illustrated in FIG. 7, the first set of traces 82 (e.g., left-most traces) are conductors to communicate or pass through the current sensor 76 signals between the first circuit board 44 and the second circuit board 46, or between the first driver portion 48 and the second driver portion 50; the second set of traces 84 (e.g., center traces) are for signaling of the high-side semiconductor switch 38 in a respective switch module 68, and the third set of traces 86 (right-most traces) are for signaling the low-side semiconductor switch 36 in a respective switch modules 68. Further, the third set of traces 86 can include ancillary or supplemental traces for carrying additional signals, such as, temperature of power semiconductor module 68.

The coil 74 is located radially outward from the output phase terminal 72 and may be formed of wire windings, insulated conductors, or circuit traces on one or more sides of the dielectric substrate of the interface board 56.

Figure 2:
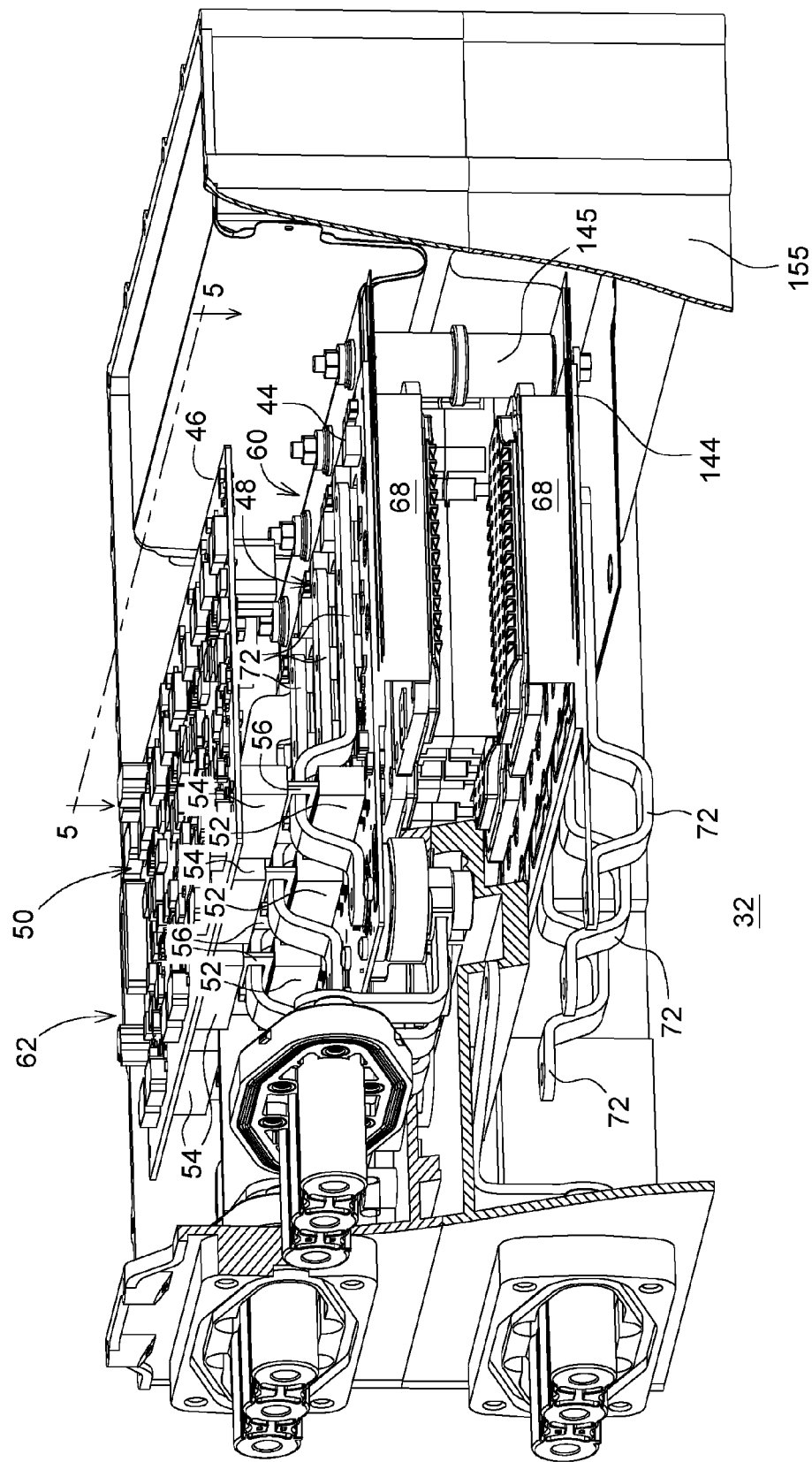
FIG. 2 is a perspective view of the electronic inverter assembly of FIG. 1.
Figure 3:
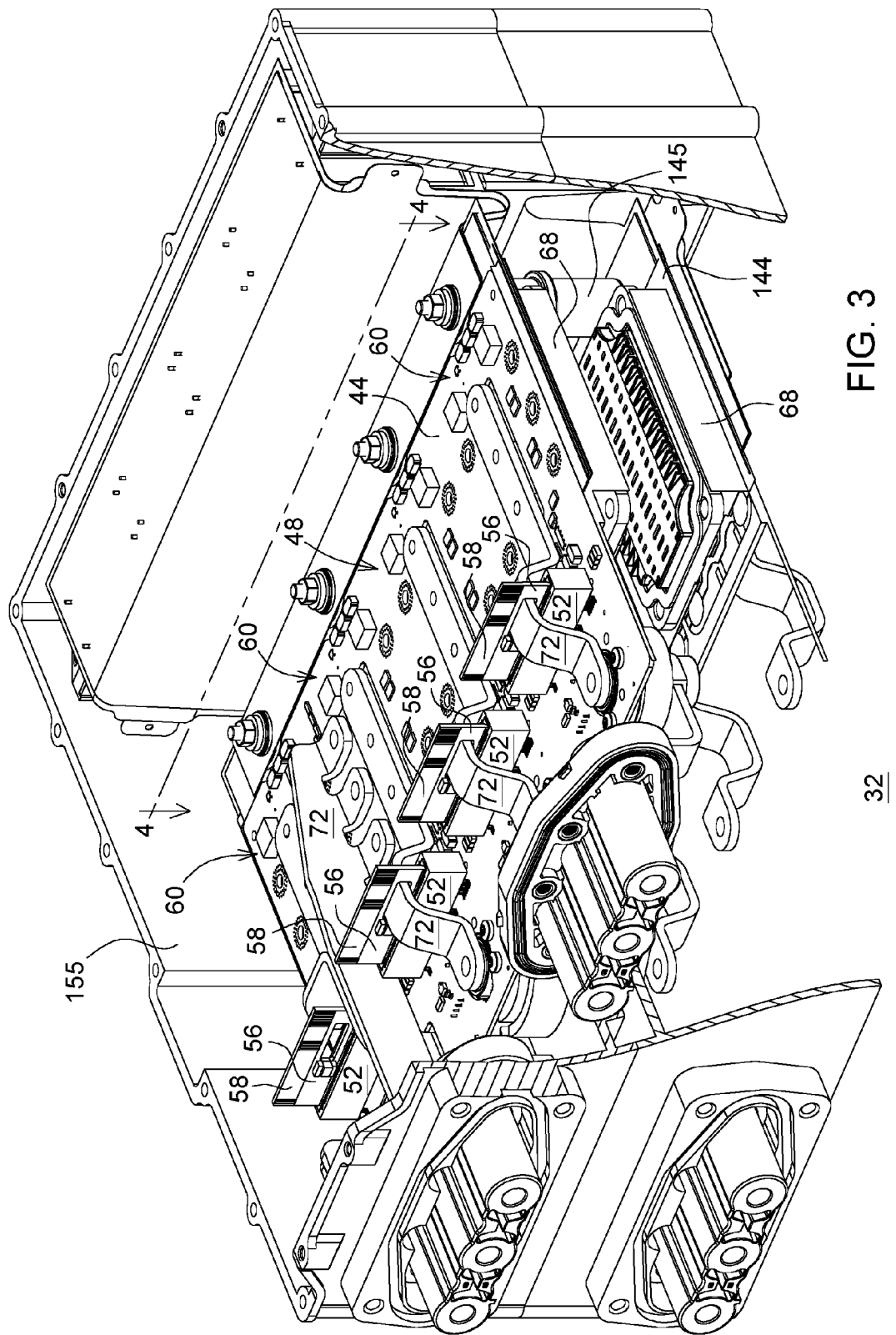
FIG. 3 is another perspective of the electronic inverter assembly of FIG. 1, where a second circuit board is removed to reveal the first circuit board.
Figure 11:
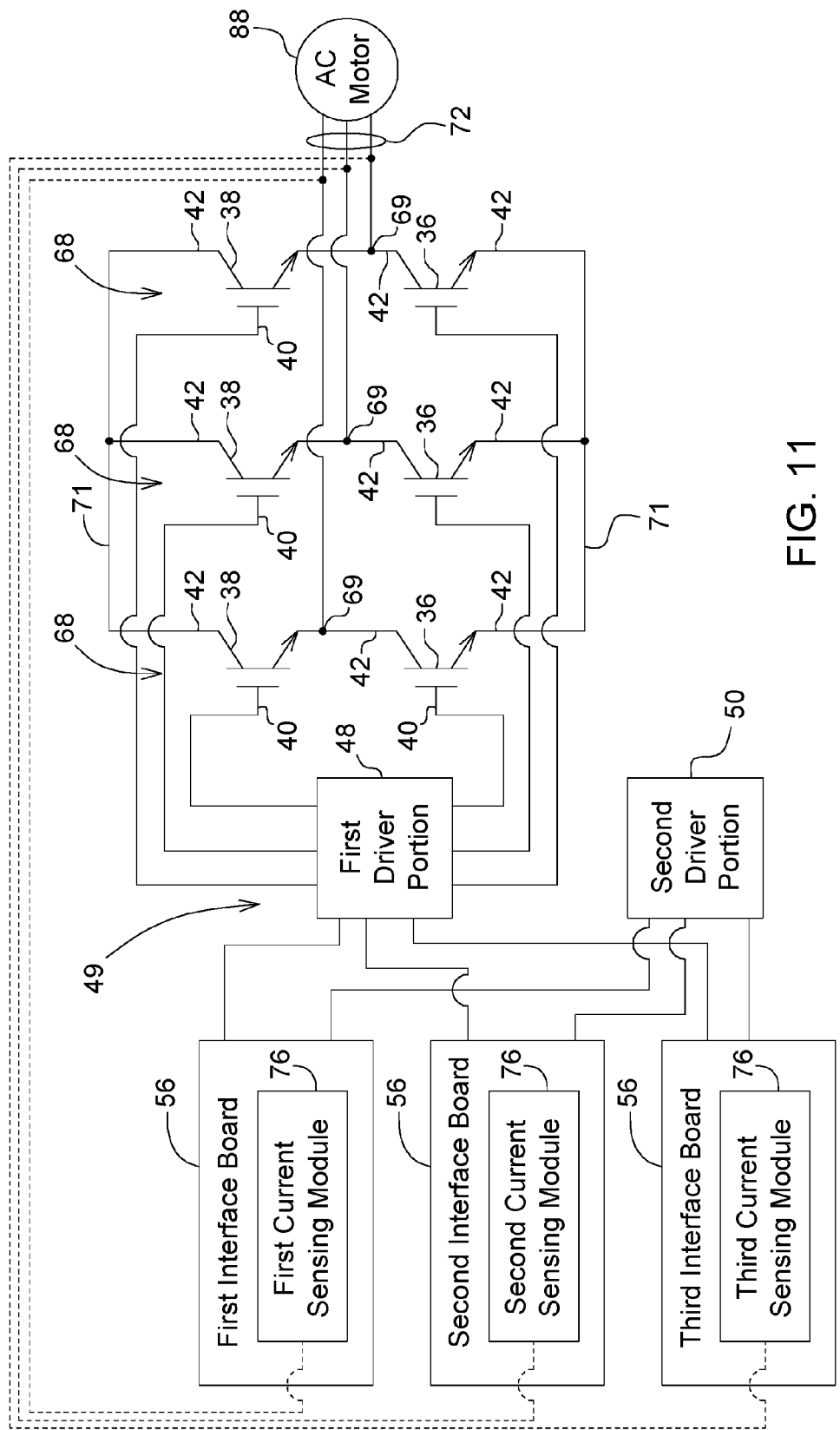
FIG. 11 is a block diagram of the electronic inverter assembly consistent with FIG. 1 through FIG. 7, which omits an optional brake chopping switch module for explanatory purposes. In any group of two or more drawings, like reference numbers indicate like elements or features.

In one configuration, the semiconductor switches (36, 38) comprise silicon carbide (SiC) or gallium (GaN) nitride switches or transistors. As illustrated in FIG. 1, FIG. 2 and FIG. 11, each phase may be packaged as a separate switch module 68 comprising a low-side switch 36 and high-side switch 38 with ones of the switched terminals 42 coupled together at a phase output node 69 and others of the switched terminals 42 coupled between the terminals of the direct current bus 71. For example, three switch modules 68 may be used for a three phase inverter, or four switch modules 68 may be used for a three phase inverter with the fourth switch module 68 is used for a brake chopper to provide regenerative energy to charge an energy storage device, such as a battery. Meanwhile, the switch module 68 has control terminals 40 of the high-side switch 38 and the low side switch 36 for receiving input signals or control signals from the driver 49, which resides on the first circuit board 44 and the second circuit board 46. Each phase has an output node 69 that is coupled to an electric motor 88.

In one embodiment, if the semiconductor switches (36, 38) comprise bipolar junction transistors or insulated gate bipolar junction transistors the switched terminals 42 comprise an emitter and a collector and the control terminal 40 comprises a base or gate. Analogously, if the semiconductor switches (36, 38) comprise field effect transistors, the switched terminals 42 comprise a source and drain and the control terminal 40 comprises a gate.

In one embodiment, the inverter power module 34 comprises a dual inverter having a primary inverter (e.g., of three phases plus a brake chopper phase) and a secondary inverter (e.g., of three phases only), where the primary inverter is mounted on a primary substrate that faces a secondary inverter mounted on a secondary substrate.

FIG. 10 is a block diagram of a current-sensing circuit. Here, in FIG. 1 magnetic field sensor 80 senses at least a direct current signal component of the observed signal in the conductor or output phase terminal 72.

Alternately, the magnetic field sensor 80 senses a direct current signal component and a lower frequency signal component (or second alternating signal component) of the alternating current signal in the conductor or output phase terminal 72. The second alternating signal component is lower in frequency than the first alternating signal component.

The current sensor 76 comprises circuitry 22 or low voltage electronics. For example, the circuitry 22 has a first filtering circuit 26 and a second filtering circuit 28 that are coupled to a sensor fusion circuit 30. As illustrated, the circuitry 22 further comprises a current change detector 24 that is capable of receiving an alternating current signal from the inductor or current-sensing coil 74.

A first filtering circuit 26 has a high-pass filter response. The first filtering circuit 26 is coupled to the inductor 74 to provide a filtered alternating current signal component (e.g., first alternating signal component). A second filtering circuit 28 has a low-pass filter response. The second filtering circuit 28 coupled to the magnetic field sensor 80 to provide: (1) a filtered direct current signal component, (2) a lower frequency alternating signal component (e.g., second alternating signal component), or both.

In one embodiment, a sensor fusion circuit 30 determines an aggregate sensed current (e.g., in the output phase terminal 72) based on the filtered alternating current signal component and the filtered direct current signal component. The aggregate sensed current (e.g., in each output phase terminal 72) refers to the combined current that includes contributions of the direct current signal components and alternating signal components.

The electronic inverter assembly 32 is well suited for reducing cost by limiting or minimizing the components that need to operate at the first temperature range. The electronic inverter assembly 32 can facilitate or leverage the use of engine coolant for cooling the electronic inverter at target power densities, such power densities per volume as greater than approximately 25 kW/L (kilowatt per liter). By minimizing inductances and maintaining inductances to less than approximately four nH (nano-Henries) for control signals to the control terminals 40 of the semiconductor switches (36, 38), electronic inverter tends to promote precise timing of control signals produced by the driver to maintain proper phase relationships of the output signal outputted by the inverter phases. For example, components can be placed close to the edge connector to minimize inductance and ensure that critical circuits don't encounter inductances greater than approximately four nH. The electronic inverter assembly 32 can be configured as a higher-power density Silicon Carbide (SiC) inverter that are cooled by engine coolant.

In FIG. 11, the inverter assembly comprises a first interface board 56 for a first phase, a second interface board 56 for a second phase and a third interface board 56 for a third phase that provide electrical and mechanical connections between the first driver portion 48 of the first circuit board 44 and the second driver portion 50 of the second circuit board 46. Each interface board 56 is associated with a current sensor 76 or current-sensing module. For example, the first interface board 56 is associated with a first current sensor 76 for sensing electrical current in the first output phase terminal 72 of the first phase; the second interface board 56 is associated with a second current sensor 76 for sensing electrical current in the second output phase terminal 72 of the second phase; the third interface board 56 is associated with a third current sensor 76 for sensing electrical current in the third output phase terminal 72 of the third phase. The driver 49 comprises the first driver portion 48 and the second driver portion 50 collectively that provide control signals to the control inputs 40 of the semiconductor switches (36, 38) for each phase. In FIG. 11, the dashed lines between each interface board 56 or the current sensor 76 represent inductive coupling between the output phase terminals (72) that are coupled to the motor 88 or electric machine.

Having described one or more embodiments in this disclosure, it will become apparent that various modifications can be made without departing from the scope of the invention as defined in the accompanying claims. For example, one or more of any dependent claims set forth in this document may be combined with any independent claim to form any combination of features set forth in the appended claims, and such combination of features in the claims are hereby incorporated by reference into the specification of this document.

The following is claimed:

1. An electronic inverter assembly, the assembly comprising:
    an inverter power module comprising one or more pairs of semiconductor switches mounted on a substrate, each pair of semiconductors comprising a low-side semiconductor switch and a high-side semiconductor switch, each of the semiconductor switches comprising a control terminal and switched terminals;
    a first circuit board having an outer side adjacent to or facing the inverter power module and a first inner side opposite the outer side;
    a first driver portion comprising a set of first components mounted on or associated with the first circuit board;
    a second circuit board spaced apart from the first circuit board, the second circuit board having a second inner side facing the first inner side;
    a second driver portion comprising a set of second components mounted on or associated with the second circuit board, where the first driver portion and the second driver portion collectively are adapted to provide input signals to the control terminal of each semiconductor switch;
    a first edge connector mounted on the first inner side of the first circuit board;
    a second edge connector mounted on the second inner side of the second circuit board; and
    an interface board with mating edges that mate with the first edge connector and the second edge connector; wherein a current sensor comprises:
    a magnetic field sensor overlying at least a portion of a plurality of conductive traces of a coil; and
    one or more flux concentrators on opposite sides of the magnetic field sensor.

2. The assembly according to claim 1 wherein the first components comprises components with higher temperature operating ranges than the second components.

3. The assembly according to claim 1 wherein the first components have a first temperature operating range of greater than or approximately equal to 150 degrees Celsius.

4. The assembly according to claim 3 wherein the second components have a second temperature operating range of between approximately 125 degrees Celsius and approximately 150 degrees Celsius.

5. The assembly according to claim 1 wherein the interface board comprises a current sensor board with an opening for an output phase terminal of one output phase of a pair of semiconductor switches.

6. The assembly according to claim 1 wherein a current sensor board comprises a plurality of conductive traces that form an inductor or a current-sensing coil for inductively coupling a current sensor on the current sensor board to the output phase terminal.

7. The assembly according to claim 6 wherein the output phase terminal has a cross section that can pass through the opening or a corresponding slit in the inductor or current-sensing coil.

8. The assembly according to claim 1 wherein the current sensor further comprises a plurality of conductive traces that form an inductor or a current-sensing coil for inductively coupling a current sensor on the current sensor board to the output phase terminal.

9. The assembly according to claim 8 wherein a first sensed current from the magnetic field sensor is fused or combined with a second sensed current from the coil, wherein the coil comprises a time-varying flux sensing coil.

10. The assembly according to claim 1 wherein a secondary current sensor is associated with the output phase terminal, the secondary current sensor comprising:
    a magnetic field sensor mounted on or near the output phase terminal;
    one or more flux concentrators disposed laterally with respect to the magnetic field sensor; and
    a multiconductor connector for connecting to the magnetic field sensor.

11. The assembly according to claim 1 wherein the interface board supports low inductance connections for the input signals to the control terminals of the semiconductor switches, where the input signals are generated by the first components and the second components collectively.

12. The assembly according to claim 1 wherein the semiconductor switches comprise silicon carbide or gallium nitride.

13. The assembly according to claim 1 wherein the inverter power module comprises a dual inverter having a primary inverter and a secondary inverter, the primary inverter mounted on a primary substrate that faces a secondary inverter mounted on a secondary substrate.

14. An electronic inverter assembly, the assembly comprising:
    an inverter power module comprising one or more pairs of semiconductor switches mounted on a substrate, each pair of semiconductors comprising a low-side semiconductor switch and a high-side semiconductor switch, each of the semiconductor switches comprising a control terminal and switched terminals;
    a first circuit board having an outer side adjacent to or facing the inverter power module and a first inner side opposite the outer side;

a first driver portion comprising a set of first components mounted on or associated with the first circuit board;

a second circuit board spaced apart from the first circuit board, the second circuit board having a second inner side facing the first inner side;

a second driver portion comprising a set of second components mounted on or associated with the second circuit board, where the first driver portion and the second driver portion collectively are adapted to provide input signals to the control terminal of each semiconductor switch;

a first edge connector mounted on the first inner side of the first circuit board;

a second edge connector mounted on the second inner side of the second circuit board; and an interface board with mating edges that mate with the first edge connector and the second edge connector, wherein the first circuit board has first plurality of first edge connectors on the first inner side, the second circuit board has a second plurality of second edge connectors on the second inner side, and further comprising a plurality of interface boards for interconnecting the first driver portion and the second driver portion.

15. The assembly according to claim 14 wherein the interface board supports low inductance connections for the input signals to the control terminals of the semiconductor switches, where the input signals are generated by the first components and the second components collectively.

* * * * *